United States Patent
Ahn et al.

(10) Patent No.: US 9,330,844 B2
(45) Date of Patent: May 3, 2016

(54) MULTILAYER CERAMIC CAPACITOR AND MOUNTING BOARD THEREFOR

(71) Applicant: SAMSUNG ELECTRO-MECHANICS CO., LTD., Suwon, Gyunggi-do (KR)

(72) Inventors: Young Ghyu Ahn, Gyunggi-do (KR); Min Cheol Park, Gyunggi-do (KR); Seok Kyoon Woo, Gyunggi-do (KR); Sang Soo Park, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 217 days.

(21) Appl. No.: 13/941,075

(22) Filed: Jul. 12, 2013

(65) Prior Publication Data
US 2014/0182910 A1    Jul. 3, 2014

(30) Foreign Application Priority Data
Jan. 2, 2013   (KR) .................. 10-2013-0000177

(51) Int. Cl.
| H01G 4/30 | (2006.01) |
| H01G 4/005 | (2006.01) |
| H01G 4/12 | (2006.01) |
| H01G 2/06 | (2006.01) |
| H05K 3/34 | (2006.01) |

(52) U.S. Cl.
CPC . *H01G 4/12* (2013.01); *H01G 2/06* (2013.01); *H05K 3/3442* (2013.01); *H05K 2201/10015* (2013.01); *H05K 2201/2045* (2013.01)

(58) Field of Classification Search
USPC ...................... 361/301.4, 311, 303
See application file for complete search history.

(56) References Cited

U.S. PATENT DOCUMENTS

| 6,370,015 | B2* | 4/2002 | Noda .............. H01G 4/232 361/305 |
| 8,638,543 | B2* | 1/2014 | Ahn et al. ............... 361/311 |
| 8,947,850 | B2* | 2/2015 | Togashi ............ H01G 4/30 361/301.3 |
| 2006/0158827 | A1* | 7/2006 | Lee et al. ............... 361/311 |
| 2007/0096254 | A1* | 5/2007 | Ritter ............... H01C 1/148 257/532 |
| 2007/0133147 | A1* | 6/2007 | Ritter ............... H01G 4/232 361/306.3 |
| 2012/0152604 | A1 | 6/2012 | Ahn et al. |
| 2012/0300361 | A1* | 11/2012 | Togashi ................ 361/301.4 |

FOREIGN PATENT DOCUMENTS

| JP | 6-215978 A | 8/1994 |
| KR | 10-1058697 B1 | 8/2011 |

* cited by examiner

*Primary Examiner* — Eric Thomas
(74) *Attorney, Agent, or Firm* — McDermott Will & Emery LLP

(57) ABSTRACT

There is provided a multilayer ceramic capacitor including: a ceramic body having dielectric layers laminated in a width direction thereof; an active region in which capacitance is formed, by including first and second internal electrodes alternately exposed to end surfaces of the ceramic body while having the dielectric layer interposed therebetween; an upper margin part prepared above the active region; a lower margin part prepared below the active region on the dielectric layer and being thicker than the upper margin part; and first and second external electrodes, wherein, when half of thickness of the ceramic body is denoted by A, thickness of the lower margin part is denoted by B, half of thickness of the active region is denoted by C, and thickness of the upper margin part is denoted by D, $1.047 \leq (B+C)/A \leq 1.562$ is satisfied.

10 Claims, 5 Drawing Sheets

MULTILAYER CERAMIC CAPACITOR AND MOUNTING BOARD THEREFOR

CROSS-REFERENCE TO RELATED APPLICATIONS

This application claims the priority of Korean Patent Application No. 10-2013-0000177 filed on Jan. 2, 2013, in the Korean Intellectual Property Office, the disclosure of which is incorporated herein by reference.

BACKGROUND OF THE INVENTION

1. Field of the Invention

The present invention relates to a multilayer ceramic capacitor and a mounting board having the multilayer ceramic capacitor mounted thereon.

2. Description of the Related Art

A multilayer ceramic capacitor, a multilayer chip electronic component, is a chip type condenser commonly mounted on printed circuit boards of various electronic products, such as image display devices including a liquid crystal display (LCD), a plasma display panel (PDP) and the like, a computer, a personal digital assistant (PDA), a mobile phone, and the like, and provided for the charging or discharging of electricity.

A multilayer ceramic capacitor (MLCC) may be used as a component in various electronic products due to having the advantages of a small size, high capacitance, and ease of mounting.

A multilayer ceramic capacitor may have a structure in which a plurality of dielectric layers and a plurality of internal electrodes having different polarities and provided between the dielectric layers, are alternately laminated with each other.

However, since these dielectric layers have piezoelectricity properties and electrostrictive properties, a piezoelectric phenomenon may occur and thus cause vibrations among the internal electrodes when AC or DC voltage is applied to the multilayer ceramic capacitor.

Such vibrations are transferred to a printed circuit board on which the multilayer ceramic capacitor is mounted, through external electrodes of the multilayer ceramic capacitor, and the entire printed circuit board becomes an acoustic reflection surface to transmit the sound of vibrations as noise.

The vibrating sound may correspond to an audible frequency range of 20 to 20000 Hz, a frequency which may cause listener discomfort and which is known as acoustic noise. Researches into the reduction of such acoustic noise are needed.

Patent Document 1 below discloses a multilayer ceramic capacitor in which a lower cover layer is thicker than an upper cover layer and internal electrodes are formed to be coplanar with respect to a substrate.

RELATED ART DOCUMENT (Patent Document 1) Japanese Patent Laid-Open Publication No. H06-215978

SUMMARY OF THE INVENTION

An aspect of the present invention provides a multilayer ceramic capacitor capable of reducing noise generated due to vibrations caused by a piezoelectric effect.

According to an aspect of the present invention, there is provided a multilayer ceramic capacitor, including: a ceramic body having a plurality of dielectric layers laminated in a width direction thereof; an active region in which capacitance is formed, by including a plurality of first and second internal electrodes alternately exposed to both end surfaces of the ceramic body while having the dielectric layer interposed therebetween; an upper margin part prepared above the active region on the dielectric layer; a lower margin part prepared below the active region on the dielectric layer, the lower margin part having a greater thickness than the upper margin part; and first and second external electrodes covering the both end surfaces of the ceramic body, wherein, when half of an overall thickness of the ceramic body is denoted by A, a thickness of the lower margin part is denoted by B, half of an overall thickness of the active region is denoted by C, and a thickness of the upper margin part is denoted by D, a ratio of deviation of a center of the active region from a center of the ceramic body, $(B+C)/A$, satisfies $1.047 \leq (B+C)/A \leq 1.562$.

Here, a ratio of the thickness D of the upper margin part to the thickness B of the lower margin part, $D/B$, may satisfy $0.048 \leq D/B \leq 0.564$.

Here, a ratio of the thickness B of the lower margin part to half A of the overall thickness of the ceramic body, $B/A$, may satisfy $0.649 \leq B/A \leq 1.182$.

Here, a ratio of half C of the overall thickness of the active region to the thickness B of the lower margin part, $C/B$, may satisfy $0.322 \leq C/B \leq 0.971$.

Here, a point of inflection formed on the both end surfaces of the ceramic body may be formed at a height equal to or below a center of the thickness of the ceramic body, due to a difference between a deformation rate occurring in the center of the active region and a deformation rate occurring in the lower margin part when voltage is applied thereto.

According to another aspect of the present invention, there is provided a mounting board for a multilayer ceramic capacitor, the mounting board including: a printed circuit board having first and second electrode pads formed thereon; and a multilayer ceramic capacitor mounted on the printed circuit board, wherein the multilayer ceramic capacitor includes: a ceramic body having a plurality of dielectric layers laminated in a width direction thereof; an active region in which capacitance is formed, by including a plurality of first and second internal electrodes alternately exposed to both end surfaces of the ceramic body while having the dielectric layer interposed therebetween; an upper margin part prepared above the active region on the dielectric layer; a lower margin part prepared below the active region on the dielectric layer, the lower margin part having a greater thickness than the upper margin part; and first and second external electrodes covering the both end surfaces of the ceramic body and connected to the first and second electrode pads through a soldering, when half of an overall thickness of the ceramic body is denoted by A, a thickness of the lower margin part is denoted by B, half of an overall thickness of the active region is denoted by C, and a thickness of the upper margin part is denoted by D, a ratio of deviation of a center of the active region from a center of the ceramic body, $(B+C)/A$, satisfies $1.047 \leq (B+C)/A \leq 1.562$.

Here, a point of inflection formed on the both end surfaces of the ceramic body may be formed at a height equal to or below that of the soldering of the ceramic body, due to a difference between a deformation rate occurring in the center of the active region and a deformation rate occurring in the lower margin part when voltage is applied thereto.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
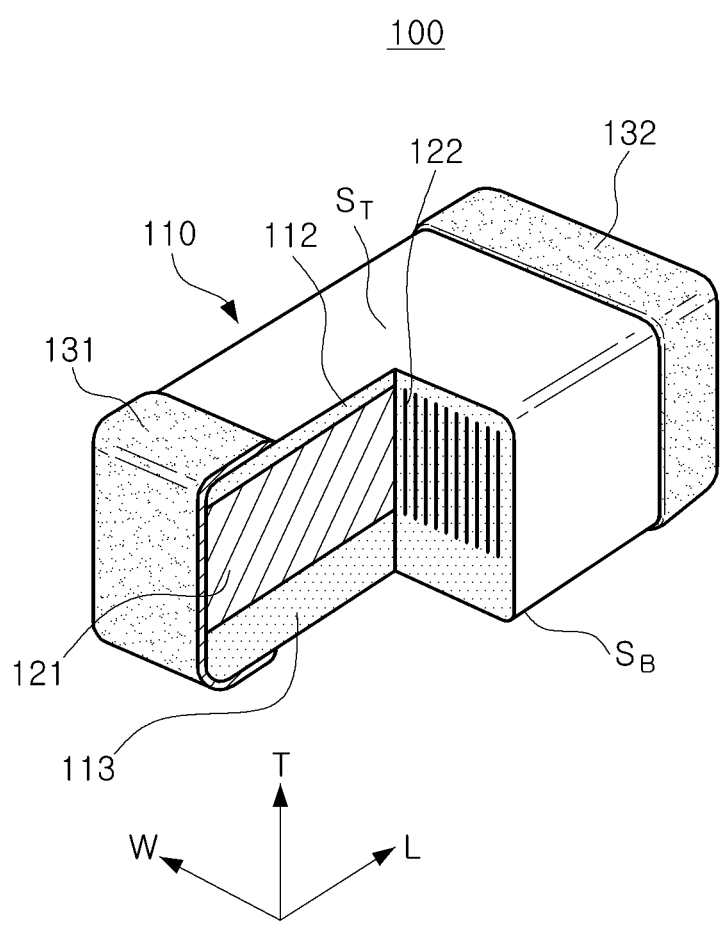
FIG. 1 is a perspective view schematically showing a multilayer ceramic capacitor according to an embodiment of the present invention from which a portion thereof is removed.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

When directions of a hexahedron are defined in order to clearly describe embodiments of the present invention, L, W, and T shown in the drawings indicate length, width, and thickness directions, respectively. Here, the width direction may also refer to a lamination direction in which dielectric layers are laminated.

In addition, in the embodiments of the present invention, surfaces of a ceramic body on which first and second external electrodes are formed in a length direction thereof are defined as both left and right end surfaces, and surfaces of the ceramic body perpendicular to the left and right end surfaces are defined as side surfaces.

Multilayer Ceramic Capacitor

Figure 2:
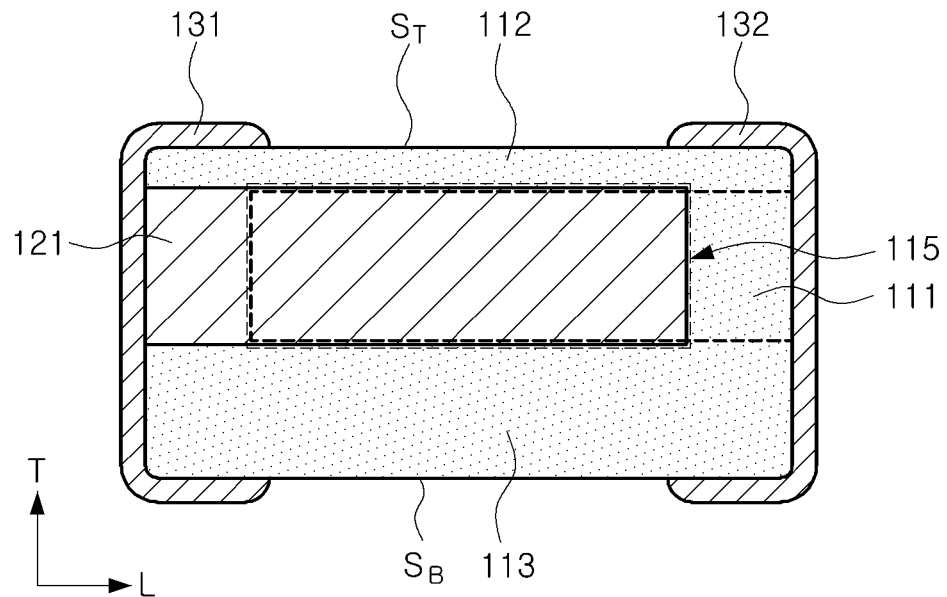
FIG. 2 is a cross-sectional view showing the multilayer ceramic capacitor of FIG. 1, cut in a length direction thereof.

Referring to FIGS. 1 and 2, a multilayer ceramic capacitor 100 according to an embodiment of the present invention may include a ceramic body 110, an active area 115 including first and second internal electrodes 121 and 122, upper and lower margin parts 112 and 113, and first and second external electrodes 131 and 132 covering both end surfaces of the ceramic body 110.

The ceramic body 110 may be formed by laminating a plurality of dielectric layers 111 in a width direction (W) and then sintering them. The shape and dimension of the ceramic body 110 and the number of dielectric layers 111 are not limited to those exemplified in the present embodiment.

In addition, the plurality of dielectric layers 111 forming the ceramic body 110 are in a sintered state, and thus, boundaries between adjacent dielectric layers 111 may be integrated such that they may not be readily discernible without a scanning electron microscope (SEM).

The ceramic body 110 may be composed of the active region 115 contributing to capacitance formation of the multilayer ceramic capacitor and the upper and lower margin parts 112 and 113 formed above and below the active region 115.

The active region 115 may be formed by repeatedly arranging a plurality of first and second internal electrodes 121 and 122 to have an overlap portion therebetween with the dielectric layers 111 interposed therebetween, the dielectric layers 111 being laminated in the width direction (W).

Here, a thickness of the dielectric layer 111 may be optionally changed according to desired capacitance of the multilayer ceramic capacitor 100. The thickness of one dielectric layer 111 may be 0.01 to 1.00 μm after sintering, but the present invention is not limited thereto.

In addition, the dielectric layer 111 may contain a ceramic powder having high dielectric permittivity, for example, a barium titanate ($BaTiO_3$) based powder or a strontium titanate ($SrTiO_3$) based powder, but the present invention is not limited thereto.

The first and second internal electrodes 121 and 122 are pairs of electrodes having opposite polarities. The first and second internal electrodes 121 and 122 may be formed by printing a predetermined thickness of conductive paste containing a conductive metal on the plurality of dielectric layers 111 laminated in the width direction (W), and they are alternately exposed to both end surfaces of the ceramic body in the length direction. The first and second internal electrodes 121 and 122 may be electrically insulated from each other by the dielectric layer 111 disposed therebetween.

That is, the first and second internal electrodes 121 and 122 may be electrically connected to the first and second external electrodes 131 and 132 by portions thereof alternately exposed to both end surfaces of the ceramic body 110.

Therefore, when voltages are applied to the first and second external electrodes 131 and 132, charges may be stored between the first and second internal electrodes 121 and 122 opposite to each other. Here, the capacitance of the multilayer ceramic capacitor 100 is proportional to an area of an overlap portion of the first and second internal electrodes 121 and 122.

Thicknesses of the first and second internal electrodes 121 and 122 may be determined depending on use thereof, and for example, may be determined within a range of 0.2 to 1.0 μm in consideration of the size of the ceramic body 110. However, the present invention is not limited thereto.

In addition, a conductive metal contained in the conductive paste for forming the first and second internal electrodes 121 and 122 may be nickel (Ni), copper (Cu), palladium (Pd), or an alloy thereof, but the present invention is not limited thereto.

In addition, the conductive paste may be printed by a screen printing method, a gravure printing method, or the like, but the present invention is not limited thereto.

The lower margin part 113 may be thicker than the upper margin part 112. That is, thicknesses of the upper and lower margin parts 112 and 113 may be adjusted by controlling the size and position of the first or second internal electrode 121 or 122.

The upper and lower margin parts 112 and 113 may basically serve to prevent damages to the first and second internal electrodes 121 and 122 due to physical or chemical stress.

Meanwhile, as necessary, a single dielectric layer or two or more dielectric layers may be further stacked on an upper surface of the upper margin part 112 and a lower surface of the lower margin part 113 in the thickness direction, thereby forming upper and lower cover layers (not shown). The upper and lower cover layers may serve to increase the thicknesses of the upper and lower margin parts 112 and 113, as necessary.

Here, the dielectric layers used in the upper and lower cover layers may be formed of the same material as the dielectric layers 111 used in the active region 115.

The first and second external electrodes 131 and 132 may be formed of a conductive paste containing a conductive metal. The conductive metal contained in the conductive paste may be nickel (Ni), copper (Cu), palladium (Pd), gold (Au), or an alloy thereof, but the present invention is not limited thereto.

Hereinafter, a relationship between dimensions of elements included in the multilayer ceramic capacitor according to the present embodiment and acoustic noise will be described.

Figure 3:
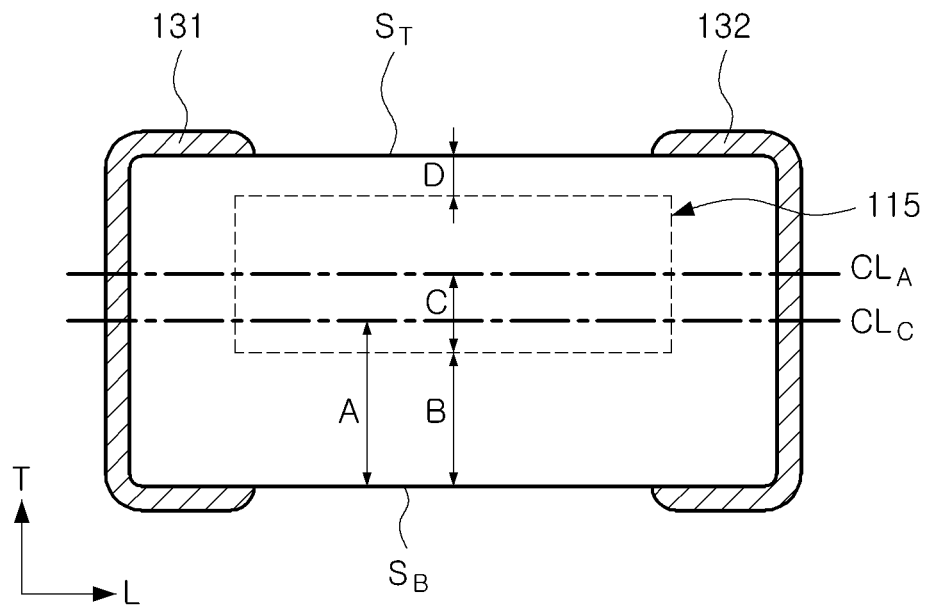
FIG. 3 is a cross-sectional view schematically showing the multilayer ceramic capacitor of FIG. 1, cut in the length direction thereof, to illustrate dimensional relationships among elements included in the multilayer ceramic capacitor.

Referring to FIG. 3, A denotes half of an overall thickness of the ceramic body 110, B denotes a thickness of the lower margin part 113, C denotes half of an overall thickness of the active region 115, and D denotes a thickness of the upper margin part 112.

Here, the overall thickness of the ceramic body 110 refers to a distance from a top surface $S_T$ to a bottom surface $S_B$ of the ceramic body 110, and the overall thickness of the active region 115 refers to the thickness of the first or second internal electrode 121 or 122.

In addition, the thickness of the lower margin part 113 B refers to a distance from a lower surface of the first or second internal electrode 121 or 122 in the thickness direction of the active region 115 to the bottom surface $S_B$ of the ceramic body 110, and the thickness of the upper margin part 112 D refers to a distance from an upper surface of the first or second internal electrode 121 or 122 in the thickness direction of the active region 115 to the top surface $S_T$ of the ceramic body 110.

When voltages having opposite polarities are applied to the first and second external electrodes 131 and 132 formed on both end surfaces of the multilayer ceramic capacitor 100, the ceramic body 110 expands and contracts in the thickness direction thereof due to an inverse piezoelectric effect occurring in the dielectric layers 111, while both end portions of the first and second external electrodes 131 and 132 contract and expand, contrary to expansion and contraction in the thickness direction of the ceramic body 110, due to the Poisson effect.

Here, a center of the active region 115 refers to maximally contracted portions of the first and second external electrodes 131 and 132, which becomes a factor in the generation of acoustic noise.

That is, according to the present embodiment of the invention, in order to reduce acoustic noise, a point of inflection (PI) formed on both end surfaces of the ceramic body 110 may be formed at a height equal to or below that of a center $CL_C$ of the thickness of the ceramic body 110, due to a difference between a deformation rate occurring in the center $CL_A$ of the active region 115 and a deformation rate occurring in the lower cover layer 113 when the voltages are applied thereto.

Here, in order to further reduce acoustic noise, a ratio of deviation of the center $CL_A$ of the active region 115 from the center $CL_C$ of the ceramic body 110, (B+C)/A, may satisfy $1.047 \leq (B+C)/A \leq 1.562$.

In addition, a ratio of the thickness D of the upper margin part 112 to the thickness B of the lower margin part 113, D/B, may satisfy $0.048 \leq D/B \leq 0.564$.

In addition, a ratio of the thickness B of the lower cover layer 113 to half A of the overall thickness of the ceramic body 110, B/A, may satisfy $0.649 \leq B/A \leq 1.182$.

In addition, a ratio of half C of the overall thickness of the active region 115 to the thickness B of the lower margin part 113, C/B, may satisfy $0.322 \leq C/B \leq 0.971$.

EXPERIMENTAL EXAMPLES

Individual multilayer ceramic capacitors according to inventive and comparative examples were manufactured as follows.

A slurry including a barium titanate ($BaTiO_3$) powder or the like was coated on carrier films and dried, to prepare a plurality of ceramic green sheets having a thickness of 1.8 μm.

Then, a conductive paste was coated on the plurality of ceramic green sheets using a screen printing method, to form the plurality of first and second internal electrodes 121 and 122, alternately exposed to both end surfaces of the ceramic green sheets.

Here, the first and second internal electrodes 121 and 122 were formed to allow the lower margin part 113 to be thicker than the upper margin part 112 in a thickness direction (T) of the ceramic green sheet, based on the first or second internal electrode 121 or 122.

Then, approximately 370 layers of the ceramic green sheets were laminated in a width direction (W) to form a laminate, and the laminate was subjected to isostatic pressing at 85° C. under 1000 kgf/cm$^2$.

Then, the pressed ceramic laminate was cut into individual chips. In addition, the cut chip was subjected to debindering at 230° C. in an atmospheric atmosphere for 60 hours.

Thereafter, the resultant chip was sintered at 1200° C. in a reduction atmosphere under an oxygen partial pressure of $10^{-11}$ atm to $10^{-10}$ atm, lower than an equilibrium oxygen partial pressure of Ni/NiO, so that the first and second internal electrodes were not oxidized. After sintering, the size of the ceramic body 110 was 1.72 mm×0.92 mm in length×width (L×W, 1709 size). Here, a manufacturing tolerance was set within a range of ±0.1 mm in length×width (L×W).

Then, the first and second external electrodes 131 and 132 were formed on both end surfaces of the ceramic body 110 while allowing the lower margin part 113 to be the bottom surface $S_B$ of the ceramic body 110, followed by a plating process, to manufacture the multilayer ceramic capacitor 100. Then, acoustic noise was measured through experimentation.

TABLE 1

| Sample | A | B | C | D | (B + C)/A | B/A | D/B | C/B | Acoustic Noise (dB) | Capacitance Implementation Ratio |
|---|---|---|---|---|---|---|---|---|---|---|
| 1* | 401.2 | 50.8 | 350.2 | 51.1 | 1.000 | 0.127 | 1.006 | 6.894 | 38.5 | OK |
| 2* | 421.6 | 50.2 | 351.7 | 89.5 | 0.953 | 0.119 | 1.783 | 7.006 | 37.8 | OK |
| 3* | 434.2 | 50.5 | 350.2 | 117.4 | 0.923 | 0.116 | 2.325 | 6.935 | 38.4 | OK |

TABLE 1-continued

| Sample | A | B | C | D | (B + C)/A | B/A | D/B | C/B | Acoustic Noise (dB) | Capacitance Implementation Ratio |
|---|---|---|---|---|---|---|---|---|---|---|
| 4* | 465.4 | 49.8 | 348.3 | 184.3 | 0.855 | 0.107 | 3.701 | 6.994 | 37.7 | OK |
| 5* | 551.2 | 50.1 | 347.2 | 357.8 | 0.721 | 0.091 | 7.142 | 6.930 | 38.2 | OK |
| 6* | 643.3 | 49.5 | 347.4 | 542.2 | 0.617 | 0.077 | 10.954 | 7.018 | 38.8 | OK |
| 7 | 420.4 | 90.2 | 349.8 | 50.9 | 1.047 | 0.215 | 0.564 | 3.878 | 29.8 | OK |
| 8 | 433.6 | 117.7 | 349.4 | 50.6 | 1.077 | 0.271 | 0.430 | 2.989 | 28.6 | OK |
| 9 | 466.6 | 182.5 | 349.9 | 50.8 | 1.141 | 0.391 | 0.278 | 1.917 | 25.4 | OK |
| 10 | 553.7 | 359.1 | 348.6 | 51.1 | 1.278 | 0.649 | 0.142 | 0.971 | 23.2 | OK |
| 11 | 640.4 | 537.8 | 345.4 | 50.2 | 1.381 | 0.840 | 0.093 | 0.644 | 23.4 | OK |
| 12 | 731.6 | 721.8 | 345.8 | 49.8 | 1.459 | 0.987 | 0.060 | 0.479 | 23.5 | OK |
| 13 | 823.1 | 896.9 | 349.1 | 51.1 | 1.514 | 1.090 | 0.057 | 0.389 | 23.3 | OK |
| 14 | 914.0 | 1080.4 | 347.7 | 92.2 | 1.562 | 1.182 | 0.048 | 0.322 | 23.1 | OK |
| 15* | 865.4 | 1080.0 | 299.2 | 52.4 | 1.594 | 1.248 | 0.049 | 0.277 | 23.2 | NG |
| 16* | 827.9 | 1079.5 | 262.7 | 50.9 | 1.611 | 1.304 | 0.047 | 0.243 | 23.2 | NG |

*Comparative Examples

Table 1 above shows dimensional data of respective parts, which were measured based on an image obtained by scanning a cross-section of the ceramic body 110 in the length-thickness (L-T) directions cut in a central portion of the ceramic body 110 of the multilayer ceramic capacitor 100 in the width (W) direction thereof, using a scanning electron microscope (SEM), as shown in FIG. 3.

Here, as described above, A denotes half of the overall thickness of the ceramic body 110; B denotes the thickness of the lower margin part 113; C denotes half of the overall thickness of the first or second internal electrode 121 or 122 corresponding to the overall thickness of the active region 115; and D denotes the thickness of the upper margin part 112.

In order to measure acoustic noise, one sample (multilayer ceramic capacitor) per one substrate for acoustic noise measurement was mounted on a printed circuit board 210 while allowing the lower margin part 113 to be the bottom surface $S_B$, and then the printed circuit board was seated on a measuring jig.

In addition, DC voltage and voltage variation were applied to the first and second external electrodes 131 and 132 of the sample seated on the measuring jig by using a DC power supply and a function generator. In addition, acoustic noise was measured through a microphone installed directly above the printed circuit board 210.

In Table 1, Sample 1 was a comparative example having a symmetrical structure in which the thickness B of the lower margin part 113 was approximately similar to the thickness D of the upper margin part 112, and Samples 2 to 6 were comparative examples having a structure in which the thickness D of the upper margin part 112 was greater than the thickness B of the lower margin part 113.

In addition, Samples 15 and 16 were comparative examples having a structure in which the thickness B of the lower margin part 113 was greater than the thickness D of the upper margin part 112, and Samples 7 to 14 were inventive examples according to the present invention.

Here, in the case in which (B+C)/A was approximately 1, it can be appreciated that the center of the active region 115 did not significantly deviate from the center of the ceramic body 110. In Sample 1 having the symmetrical structure in which the thickness B of the lower margin part 113 was approximately similar to the thickness D of the upper margin part 112, (B+C)/A was approximately 1.

Here, in the case in which (B+C)/A was greater than 1, it can be appreciated that the center of the active region 115 deviated from the center of the ceramic body 110 upwardly.

Here, in the case in which (B+C)/A was less than 1, it can be appreciated that the center of the active region 115 deviated from the center of the ceramic body 110 downwardly.

Referring to Table 1, it may be confirmed that in Samples 7 to 14 (inventive examples) and Samples 15 and 16 (comparative examples) in which the ratio of deviation of the center of the active region 15 from the center of the ceramic body 110, (B+C)/A, satisfied 1.047≤(B+C)/A, acoustic noise was remarkably reduced to be less than 30 dB.

In addition, in Samples 1 to 6 in which the ratio of deviation of the center of the active region 115 from the center of the ceramic body 110, (B+C)/A was less than 1.047, the center of the active region 115 scarcely deviated from the center of the ceramic body 110 or the center of the active region 115 deviated from the center of the ceramic body 110 downwardly. It may be seen that acoustic noise in Samples 1 to 6 was higher than 30 dB, which was remarkably high as compared with the inventive examples according to the present invention.

In addition, in Samples 15 and 16 in which the ratio of deviation of the center of the active region 115 from the center of the ceramic body 110, (B+C)/A, was greater than 1.745, acoustic noise was reduced, but capacitance was excessively lowered as compared with target capacitance, causing defects in capacitance.

In Table 1, in the case in which a "Capacitance Implementation Ratio" (that is, a ratio of actual capacitance to target capacitance) is marked by "NG", it means that an actual capacitance value was below 80% when a target capacitance value was 100%.

In addition, it may be seen that, in Samples 7 to 14 in which the ratio of the thickness D of the upper margin part 112 to the thickness B of the lower margin part 113, D/B, satisfied 0.048≤D/B≤0.564, acoustic noise was remarkably reduced.

On the other hand, in Samples 1 to 6 in which the ratio of the thickness D of the upper margin part 112 to the thickness B of the lower margin part 113, D/B, was greater than 0.564, it may be confirmed that the effect of reducing acoustic noise was not achieved.

Meanwhile, in Samples 10 to 14 in which the ratio of the thickness B of the lower margin part 113 to half A of the overall thickness of the ceramic body 110, B/A, and the ratio of half C of the overall thickness of the active region 115 to the thickness B of the lower margin part 113, C/B, satisfied 0.649≤B/A≤1.182 and 0.322≤C/B≤0.971, it may be confirmed that acoustic noise was further reduced to be less than 25 dB.

On the other hand, in Samples 15 and 16 in which the ratio of the thickness B of the lower margin part 113 to half A of the overall thickness of the ceramic body 110, B/A, was greater than 1.182, or the ratio of half C of the overall thickness of the active region 115 to the thickness B of the lower margin part 113, C/B, was less than 0.322, the ratio of the actual capacitance to the target capacitance was low, resulting in defects in capacitance.

Mounting Board for Multilayer Ceramic Capacitor

Figure 4:
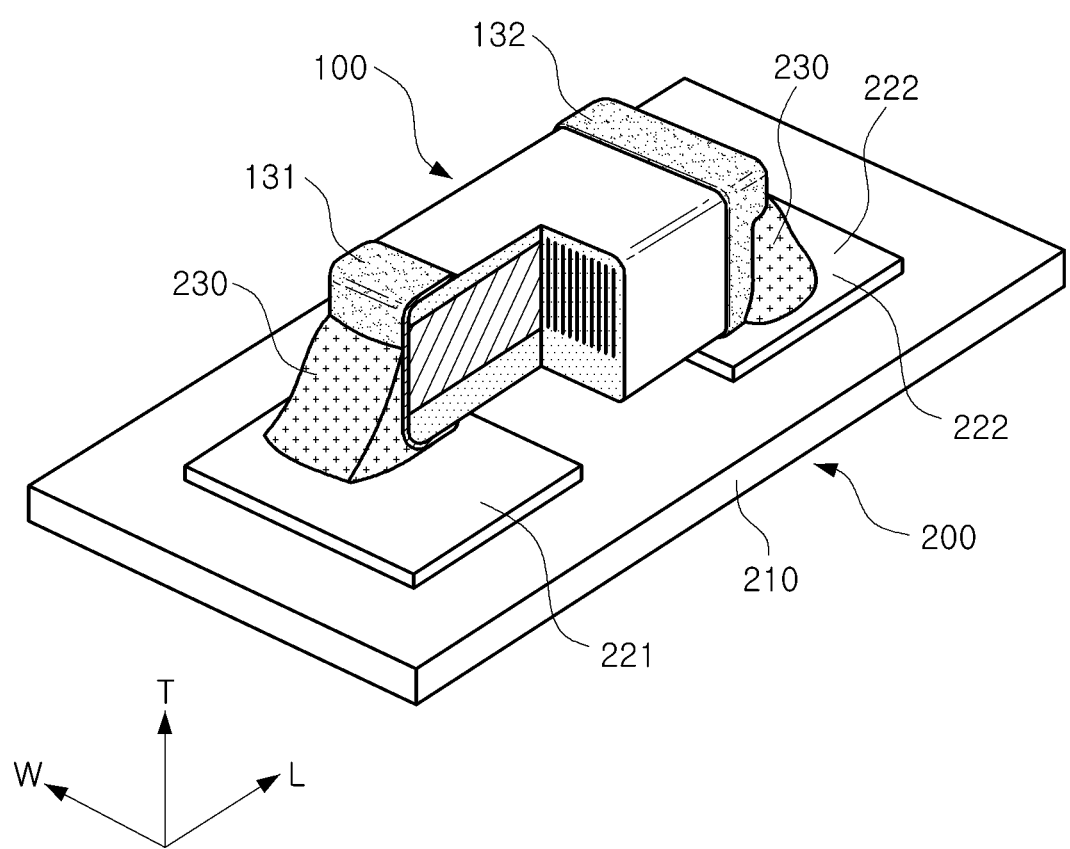
FIG. 4 is a perspective view showing a state in which the multilayer ceramic capacitor of FIG. 1 is mounted on a printed circuit board.
Figure 5:
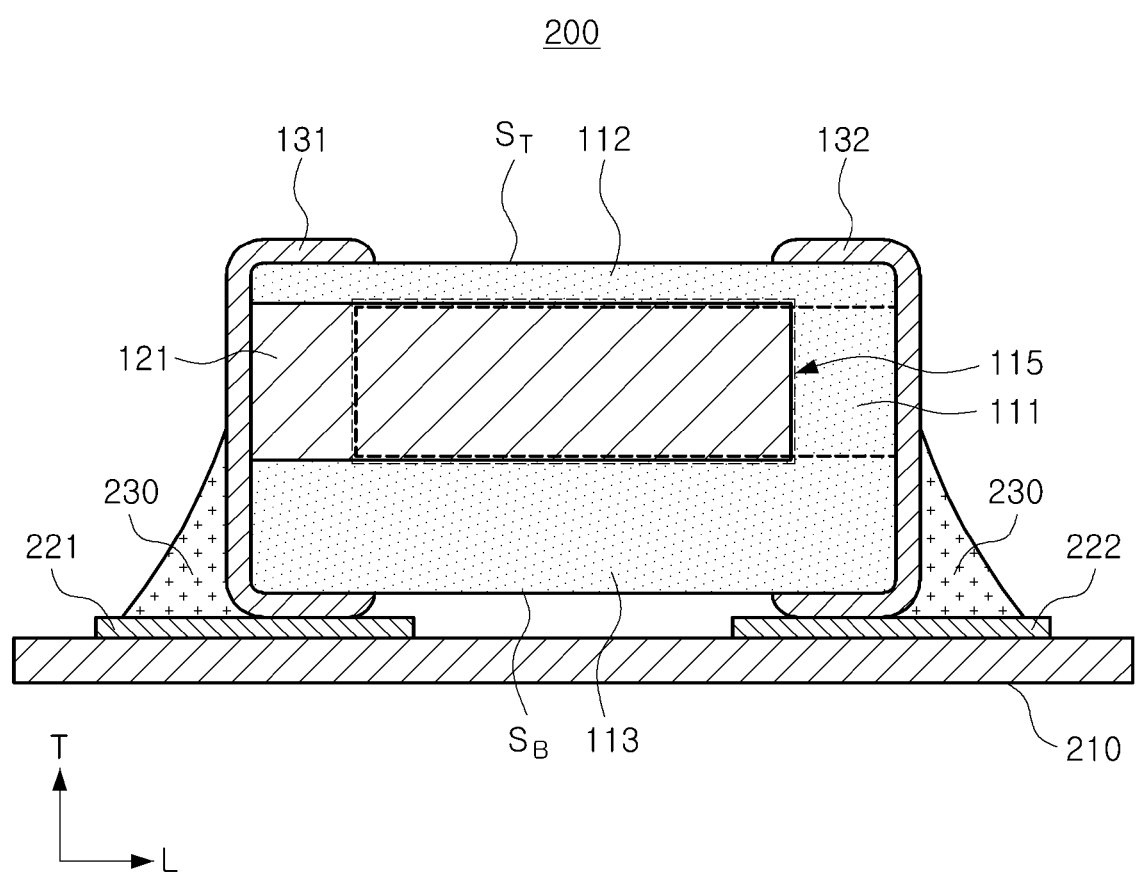
FIG. 5 is a cross-sectional view showing the multilayer ceramic capacitor and the printed circuit board of FIG. 4, cut in the length direction thereof.

Referring to FIGS. 4 and 5, a mounting board 200 for the multilayer ceramic capacitor 100 according to the present embodiment may include a printed circuit board 210 on which the multilayer ceramic capacitor 100 is vertically mounted; and first and second electrode pads 221 and 222 spaced apart from each other on an upper surface of the printed circuit board 210.

Here, the multilayer ceramic capacitor 100 may be electrically connected to the printed circuit board 210 by soldering 230 while the lower margin part 113 is disposed to form a lower portion of the multilayer ceramic capacitor 100, and the first and second external electrodes 131 and 132 are positioned on and in contact with the first and second electrode pads 221 and 222, respectively.

When voltage is applied in the state in which the multilayer ceramic capacitor 100 is mounted on the printed circuit board 210 as described above, acoustic noise may be generated.

Here, the amount of soldering 230 required to connect the first and second external electrodes 131 and 132 of the multilayer ceramic capacitor 100 to the first and second electrode pads 221 and 222 may be determined according to the size of the first and second electrode pads 221 and 222. In addition, the level of acoustic noise may be controlled according to the amount of soldering 230.

Figure 6:
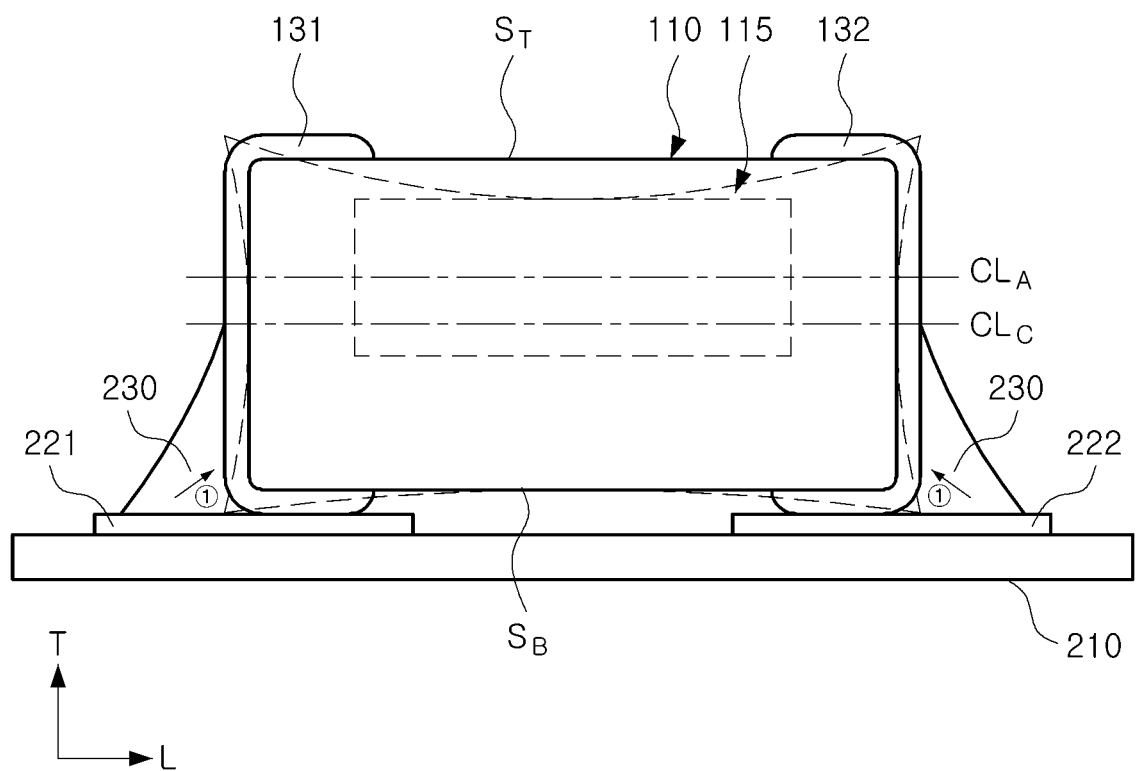
FIG. 6 is a cross-sectional view schematically showing deformation of the multilayer ceramic capacitor of FIG. 4 when voltage is applied thereto in a state in which the multilayer ceramic capacitor is mounted on the printed circuit board.

Referring to FIG. 6, when voltages having opposite polarities are applied to the first and second external electrodes 131 and 132 formed on both end surfaces of the multilayer ceramic capacitor 100 in the state in which the multilayer ceramic capacitor 100 is mounted on the printed circuit board 210, the ceramic body 110 expands and contracts in the thickness direction thereof due to an inverse piezoelectric effect occurring in the dielectric layers 111, and the first and second external electrodes 131 and 132 contract and expand, contrary to expansion and contraction in the thickness direction of the ceramic body 110, due to the Poisson effect.

Here, a center of the active region 115 refers to maximally contracted portions of the first and second external electrodes 131 and 132, which becomes a factor in the generation of acoustic noise.

When the bottom surface $S_B$ of the multilayer ceramic capacitor 100 contracts inwardly in the thickness direction by a significant amount, contraction force ① is generated to cause a lower portion of the soldering 230 to be drawn inwardly through force exerted on the external electrodes, and thus the top surface $S_T$ and side surfaces of the ceramic body 110 also contract.

Therefore, in the present embodiment, when a point of inflection formed on both end surfaces of the ceramic body 110 is formed at a height equal to or below that of the soldering 230, due to a difference between a deformation rate occurring in the center $CL_A$ of the active region 115 and a deformation rate occurring in the lower margin part 113 when the voltages are applied thereto, acoustic noise may be further reduced.

As set forth above, according to embodiments of the present invention, vibrations generated by a multilayer ceramic capacitor can be decreased and thus, an amount of acoustic noise generated by a printed circuit board can be reduced.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor, comprising:
   a ceramic body having a plurality of dielectric layers laminated in a width direction thereof;
   an active region in which capacitance is formed, by including a plurality of first and second internal electrodes alternately exposed to both end surfaces of the ceramic body while having the dielectric layer interposed therebetween;
   an upper margin part prepared above the active region on the dielectric layer;
   a lower margin part prepared below the active region on the dielectric layer, the lower margin part having a greater thickness than the upper margin part; and
   first and second external electrodes covering the both end surfaces of the ceramic body,
   wherein, when half of an overall thickness of the ceramic body is denoted by A, a thickness of the lower margin part is denoted by B, half of an overall thickness of the active region is denoted by C, and a thickness of the upper margin part is denoted by D, a ratio of deviation of a center of the active region from a center of the ceramic body, (B+C)/A, satisfies $1.047 \leq (B+C)/A \leq 1.562$, and
   wherein the first and second internal electrodes of the active region are disposed to be vertical with a mounting surface.

2. The multilayer ceramic capacitor of claim 1, wherein a ratio of the thickness D of the upper margin part to the thickness B of the lower margin part, D/B, satisfies $0.048 \leq D/B \leq 0.564$.

3. The multilayer ceramic capacitor of claim 1, wherein a ratio of the thickness B of the lower margin part to half A of the overall thickness of the ceramic body, B/A, satisfies $0.649 \leq B/A \leq 1.182$.

4. The multilayer ceramic capacitor of claim 1, wherein a ratio of half C of the overall thickness of the active region to the thickness B of the lower margin part, C/B, satisfies $0.322 \leq C/B \leq 0.971$.

5. The multilayer ceramic capacitor of claim 1, wherein a point of inflection formed on the both end surfaces of the ceramic body is formed at a height equal to or below a center of the thickness of the ceramic body, due to a difference between a deformation rate occurring in the center of the active region and a deformation rate occurring in the lower margin part when voltage is applied thereto.

6. A mounting board for a multilayer ceramic capacitor, the mounting board comprising:
   a printed circuit board having first and second electrode pads formed thereon; and
   a multilayer ceramic capacitor mounted on the printed circuit board,
   wherein the multilayer ceramic capacitor includes:
   a ceramic body having a plurality of dielectric layers laminated in a width direction thereof;
   an active region in which capacitance is formed, by including a plurality of first and second internal electrodes alternately exposed to both end surfaces of the ceramic body while having the dielectric layer interposed therebetween;

an upper margin part prepared above the active region on the dielectric layer;

a lower margin part prepared below the active region on the dielectric layer, the lower margin part having a greater thickness than the upper margin part; and first and second external electrodes covering the both end surfaces of the ceramic body and connected to the first and second electrode pads through a soldering, when half of an overall thickness of the ceramic body is denoted by A, a thickness of the lower margin part is denoted by B, half of an overall thickness of the active region is denoted by C, and a thickness of the upper margin part is denoted by D, a ratio of deviation of a center of the active region from a center of the ceramic body, $(B+C)/A$, satisfies $1.047 \leq (B+C)/A \leq 1.562$, wherein the first and second internal electrodes of the active region are disposed to be vertical with a mounting surface.

7. The mounting board of claim 6, wherein a ratio of the thickness D of the upper margin part to the thickness B of the lower margin part, D/B, satisfies $0.048 \leq D/B \leq 0.564$.

8. The mounting board of claim 6, wherein a ratio of the thickness B of the lower margin part to half A of the overall thickness of the ceramic body, B/A, satisfies $0.649 \leq B/A \leq 1.182$.

9. The mounting board of claim 6, wherein a ratio of half C of the overall thickness of the active region to the thickness B of the lower margin part, C/B, satisfies $0.322 \leq C/B \leq 0.971$.

10. The mounting board of claim 6, wherein a point of inflection formed on the both end surfaces of the ceramic body is formed at a height equal to or below that of the soldering of the ceramic body, due to a difference between a deformation rate occurring in the center of the active region and a deformation rate occurring in the lower margin part when voltage is applied thereto.

* * * * *